US010026629B2

(12) United States Patent
Nakamori et al.

(10) Patent No.: US 10,026,629 B2
(45) Date of Patent: Jul. 17, 2018

(54) SUBSTRATE LIQUID PROCESSING APPARATUS, SUBSTRATE LIQUID PROCESSING METHOD, AND COMPUTER-READABLE STORAGE MEDIUM STORING SUBSTRATE LIQUID PROCESSING PROGRAM

(71) Applicant: Tokyo Electron Limited, Tokyo (JP)

(72) Inventors: Mitsunori Nakamori, Kumamoto (JP); Junichi Kitano, Kumamoto (JP); Teruomi Minami, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/880,462

(22) Filed: Oct. 12, 2015

(65) Prior Publication Data

US 2016/0111303 A1 Apr. 21, 2016

(30) Foreign Application Priority Data

Oct. 17, 2014 (JP) .................................. 2014-213012
Aug. 27, 2015 (JP) .................................. 2015-167418

(51) Int. Cl.
*H01L 21/02* (2006.01)
*H01L 21/67* (2006.01)
*B08B 3/08* (2006.01)

(52) U.S. Cl.
CPC .. *H01L 21/67051* (2013.01); *H01L 21/02057* (2013.01); *H01L 21/67028* (2013.01); *B08B 3/08* (2013.01)

(58) Field of Classification Search
None
See application file for complete search history.

(56) References Cited

U.S. PATENT DOCUMENTS

| 5,626,913 A * | 5/1997 | Tomoeda ................ G03F 7/162 |
| | | 396/611 |
| 2013/0133695 A1* | 5/2013 | Minami ............ H01L 21/67034 |
| | | 134/18 |
| 2014/0060575 A1* | 3/2014 | Lee ................... H01L 21/02057 |
| | | 134/4 |

FOREIGN PATENT DOCUMENTS

| JP | 2010-045389 A | 2/2010 |
| JP | 2011-071169 | * 4/2011 |
| JP | 2011-124410 A | 6/2011 |

OTHER PUBLICATIONS

Computer translation of JP2011-071169 by Kitagawa et al., published Apr. 7, 2011.*

* cited by examiner

*Primary Examiner* — Mikhail Kornakov
*Assistant Examiner* — Ryan L. Coleman
(74) *Attorney, Agent, or Firm* — Abelman, Frayne & Schwab (57) ABSTRACT

Disclosed is a substrate liquid processing apparatus. The apparatus includes: a pure water supply unit (a rinse liquid supply unit) configured to supply pure water to a substrate; and a drying liquid supply unit configured to supply a drying liquid having a higher volatility than the pure water to the substrate. The substrate liquid processing apparatus is used to supply the drying liquid having the higher volatility, of which a part contains a silicon-based organic compound, to the substrate, from the drying liquid supply unit.

5 Claims, 5 Drawing Sheets

SUBSTRATE LIQUID PROCESSING APPARATUS, SUBSTRATE LIQUID PROCESSING METHOD, AND COMPUTER-READABLE STORAGE MEDIUM STORING SUBSTRATE LIQUID PROCESSING PROGRAM

CROSS-REFERENCE TO RELATED APPLICATIONS

This application is based on and claims priority from Japanese Patent Application Nos. 2014-213012, and 2015-167418 filed on Oct. 17, 2014, and Aug. 27, 2015, respectively, with the Japan Patent Office, the disclosures of which are incorporated herein in their entireties by reference.

TECHNICAL FIELD

The present disclosure relates to a substrate liquid processing apparatus for drying a substrate which has been subjected to a liquid processing by using a drying liquid, a substrate liquid processing method, and a computer-readable storage medium storing a substrate liquid processing program.

BACKGROUND

When, for example, a semiconductor component or a flat panel display is manufactured, a substrate liquid processing apparatus has conventionally been used to perform various liquid processings such as, for example, cleaning and etching, on a substrate such as, for example, a semiconductor wafer or a liquid crystal substrate.

In the substrate liquid processing apparatus, after a liquid processing of the substrate is performed by supplying a processing liquid such as, for example, a cleaning liquid or an etching liquid, to the substrate, a rinsing process of the substrate is performed by supplying a rinse liquid (e.g., pure water) to the substrate. Then, a drying treatment of the substrate is performed by removing the rinse liquid from the substrate. In this drying treatment, by the action of surface tension of the rinse liquid remaining on the substrate (especially, between patterns such as, for example, circuit patterns or resist patterns), a pattern formed on the substrate may collapse.

Accordingly, conventionally, the drying treatment of the substrate has been performed by replacing the rinse liquid with a drying liquid which has a smaller surface tension than the rinse liquid, and then, removing the drying liquid from the substrate (see, e.g., Japanese Patent Laid-Open Publication No. 2010-45389). As for the drying liquid, an alcohol-based organic compound such as, for example, isopropyl alcohol (IPA) has been mainly used.

SUMMARY

The present disclosure provides a substrate liquid processing apparatus including: a pure water supply unit configured to supply pure water to a substrate; and a drying liquid supply unit configured to supply a drying liquid having a higher volatility than the pure water to the substrate. The drying liquid supply unit supplies the drying liquid having the higher volatility, of which a part contains a silicon-based organic compound, to the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

As a pattern such as, for example, a circuit pattern or a resist pattern formed on the substrate is miniaturized, the pattern may collapse even if a drying treatment is performed using a conventional alcohol-based organic compound such as, for example, IPA, as a drying liquid.

Accordingly, what is requested is to develop a substrate liquid processing apparatus capable of satisfactorily drying a substrate without causing a collapse of a miniaturized pattern.

According to the present disclosure, a substrate liquid processing apparatus includes: a pure water supply unit configured to supply pure water to a substrate; and a drying liquid supply unit configured to supply a drying liquid having a higher volatility than the pure water to the substrate. The drying liquid supply unit supplies the drying liquid having the higher volatility, of which a part contains a silicon-based organic compound, to the substrate.

The drying liquid supply unit includes a first chemical liquid supply unit configured to supply a first chemical liquid containing a silicon-based organic compound, and a second chemical liquid supply unit configured to supply a second chemical liquid containing another organic compound. The drying liquid supply unit supplies a mixed liquid of the first chemical liquid and the second chemical liquid to the substrate.

The drying liquid supply unit supplies the second chemical liquid that does not contain the first chemical liquid from the second chemical liquid supply unit after supplying the mixed liquid.

The drying liquid supply unit supplies the second chemical liquid that does not contain the first chemical liquid from the second chemical liquid supply unit before supplying the mixed liquid.

The drying liquid supply unit supplies the first chemical liquid and the second chemical liquid at once from the first chemical liquid supply unit and the second chemical liquid supply unit.

The drying liquid supply unit supplies the mixed liquid obtained by mixing the first chemical liquid with the second chemical liquid in advance.

Also, according to the present disclosure, a substrate liquid processing method includes: supplying pure water to a substrate; supplying a drying liquid having a higher volatility than the pure water to the substrate; and drying the substrate. The drying of the substrate includes supplying a drying liquid to the substrate, and removing the drying liquid from the substrate, and the supplying of the drying liquid includes supplying the drying liquid having the higher volatility, of which a part contains a silicon-based organic compound.

The drying liquid is a mixed liquid including a first chemical liquid containing a silicon-based organic compound, and a second chemical liquid containing another organic compound, and the supplying of the drying liquid includes supplying the mixed liquid.

The substrate liquid processing method further includes performing a post-treatment process of supplying the second chemical liquid that does not contain the first chemical liquid after supplying the mixed liquid.

The substrate liquid processing method further includes performing a pre-treatment process of supplying the second chemical liquid that does not contain the first chemical liquid before supplying the mixed liquid.

The first chemical liquid and the second chemical liquid are supplied at once.

The mixed liquid obtained by mixing the first chemical liquid with the second chemical liquid in advance is supplied.

When the mixed liquid of the first chemical liquid and the second chemical liquid is supplied, a mixing ratio of the first chemical liquid to the second chemical liquid is changed in a stepwise or continuous manner.

When the mixed liquid of the first chemical liquid and the second chemical liquid is supplied, an active agent for the first chemical liquid is added.

IPA is used as the second chemical liquid, and PGMEA is supplied to the substrate between the pre-treatment process and the supplying of the mixed liquid.

Also, according to the present disclosure, there is provided a non-transitory computer-readable storage medium storing a substrate liquid processing program that, when executed, causes a substrate to be processed using the substrate liquid processing program is configured to process a substrate using a substrate liquid processing apparatus including a processing liquid supply unit configured to supply a processing liquid to the substrate, a rinse liquid supply unit configured to supply a rinse liquid to the substrate, and a drying liquid supply unit configured to supply a drying liquid to the substrate. The substrate liquid processing program causes the drying liquid supply unit to supply the drying liquid of which at least a part contains a silicon-based organic compound to the substrate.

In the present disclosure, a substrate that has been subjected to a liquid processing may be satisfactorily dried without causing a collapse of a miniaturized pattern.

Hereinafter, descriptions will be made on a specific configuration of a substrate liquid processing apparatus and a substrate liquid processing method according to the present disclosure with reference to drawings.

Figure 1:
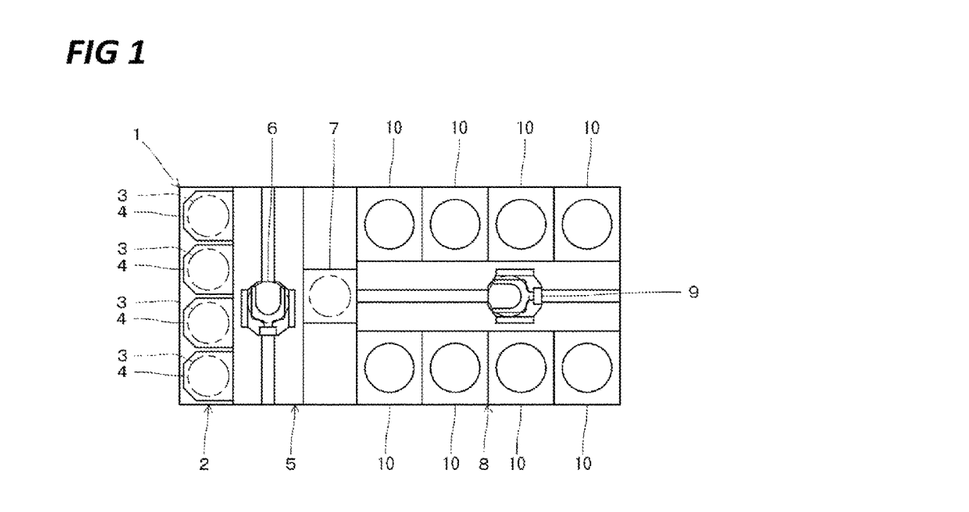
FIG. 1 is a plan view illustrating a substrate liquid processing apparatus.

As illustrated in FIG. 1, a substrate liquid processing apparatus 1 includes a carry in/out section 2 formed at a front end thereof. Carriers 4, each of which accommodates a plurality of substrates 3 (e.g., 25 substrates) (herein, semiconductor wafers), are carried into or out of the carry in/out section 2, and are placed to be laterally aligned.

Also, the substrate liquid processing apparatus 1 has a conveyance section 5 formed on the rear of the carry in/out section 2. A substrate conveyance device 6 is disposed at the front side in the conveyance section 5, and a substrate delivery unit 7 is disposed at the rear side in the conveyance section 5. In the conveyance section 5, the substrates 3 are conveyed between any one carrier 4 placed on the carry in/out section 2 and the substrate delivery unit 7 using the substrate conveyance device 6.

Also, the substrate liquid processing apparatus 1 includes a processing section 8 formed on the rear of the conveyance section 5. A substrate conveyance device 9 is disposed at the center of the processing section 8 to extend in a front-rear direction, and also substrate liquid processing units 10 configured to perform liquid processings on the substrates 3 are disposed at the left and right sides of the substrate conveyance device 9 to be aligned in the front-rear direction. In this processing section 8, the substrates 3 are conveyed using the substrate conveyance device 9 between the substrate delivery unit 7 and the substrate liquid processing units 10, and the liquid processings of the substrates 3 are performed using the substrate liquid processing units 10.

Figure 2:
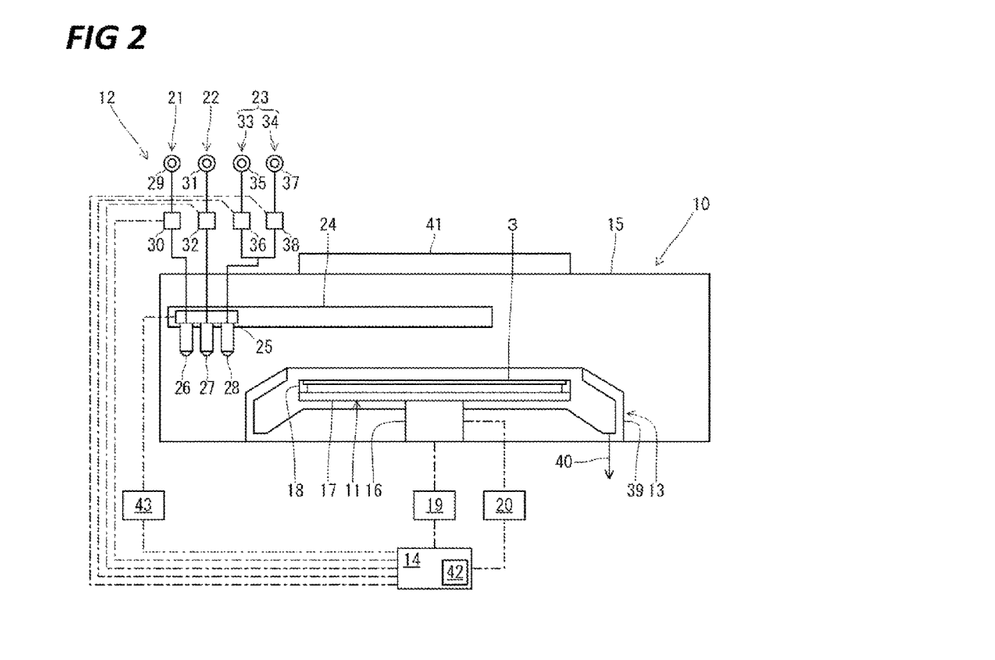
FIG. 2 is a side view illustrating a substrate liquid processing unit.

As illustrated in FIG. 2, the substrate liquid processing unit 10 includes a substrate holding unit 11, a liquid supply unit 12, and a liquid collecting unit 13, which are controlled by a controller 14. Here, the substrate holding unit 11 rotates the substrate 3 while holding the substrate 3. The liquid supply unit 12 supplies various liquids to the substrate 3. The liquid collecting unit 13 collects the various liquids supplied to the substrate 3. The controller 14 controls not only the substrate liquid processing unit 10, but also the whole of the substrate liquid processing apparatus 1.

In the substrate holding unit 11, a vertically extending rotary shaft 16 is rotatably provided at substantially the center within a processing chamber 15. A disk-shaped turn table 17 is horizontally attached to the upper end of the rotary shaft 16. A plurality of substrate holders 18 are attached to the outer peripheral edge of the turn table 17 at equal intervals in the circumferential direction.

In the substrate holding unit 11, a substrate rotation mechanism 19 and a substrate elevating mechanism 20 are connected to the rotary shaft 16. The rotation or elevation of the substrate rotation mechanism 19 and the substrate elevating mechanism 20 is controlled by the controller 14.

The substrate holding unit 11 horizontally holds the substrate 3 by the substrate holders 18 of the turn table 17. The substrate holding unit 11 rotates the substrate 3 held by the turn table 17 by driving the substrate rotation mechanism 19. The substrate holding unit 11 elevates the turn table 17 or the substrate 3 by driving the substrate elevating mechanism 20.

The liquid supply unit 12 includes a processing liquid supply unit 21, a rinse liquid supply unit 22, and a drying liquid supply unit 23. Here, the processing liquid supply unit 21 supplies a processing liquid (here, a cleaning chemical liquid) to the substrate 3. The rinse liquid supply unit 22 supplies a rinse liquid (here, pure water) to the substrate 3 which has been subjected to the liquid processing by the processing liquid. Accordingly, the rinse liquid supply unit 22 serves as a pure water supply unit of the present disclosure. The drying liquid supply unit 23 supplies a drying liquid (here, a chemical liquid containing a silicon-based organic compound and an alcohol-based organic compound) to the substrate 3 which has been rinsed by the rinse liquid.

In the liquid supply unit 12, a guide rail 24 is provided to laterally extend in the horizontal direction in the processing chamber 15. An arm 25 that horizontally extends in the front-rear direction is provided to the guide rail 24 to be movable in the lateral direction. The arm 25 is connected to a nozzle moving mechanism 43. A movement control of the nozzle moving mechanism 43 is performed by the controller 14. A processing liquid supply nozzle 26, a rinse liquid supply nozzle 27, and a drying liquid supply nozzle 28 are attached to the arm 25 to be oriented vertically downward. In the present exemplary embodiment, all the nozzles 26, 27, and 28 are attached to one arm 25, but the present disclosure is not limited thereto. The respective nozzles 26, 27, and 28 or combinations thereof may be attached to separate arms. The rinse liquid supply nozzle 27 and the drying liquid supply nozzle 28 may be configured as a common nozzle so that the supply of the rinse liquid and the supply of the drying liquid from the same nozzle may be continuously performed. Accordingly, when the rinse liquid is switched to the drying liquid, the surface of the substrate 3 may not be exposed so that the surface hardly comes in contact with the atmosphere (ambient gas).

In the processing liquid supply unit 21, a processing liquid supply source 29 is connected to the processing liquid supply nozzle 26 through a pipe and a flow rate controller 30. The flow rate control of the flow rate controller 30 is performed by the controller 14.

In the rinse liquid supply unit 22, a rinse liquid supply source 31 is connected to the rinse liquid supply nozzle 27 through a pipe and a flow rate controller 32. The flow rate control of the flow rate controller 32 is performed by the controller 14.

The drying liquid supply unit 23 includes a first chemical liquid supply unit 33 configured to supply a first chemical liquid (here, trimethylsilyl dimethylamine (TMSDMA)) containing a silicon-based organic compound, and a second chemical liquid supply unit 34 configured to supply a second chemical liquid (here, isopropyl alcohol (IPA)) containing another organic compound (here, an alcohol-based organic compound).

In the first chemical liquid supply unit 33, a first chemical liquid supply source 35 configured to supply the first chemical liquid is connected to the drying liquid supply nozzle 28 through a pipe and a flow rate controller 36. Also, in the second chemical liquid supply unit 34, a second chemical liquid supply source 37 configured to supply the second chemical liquid is connected to the drying liquid supply nozzle 28 through a pipe and a flow rate controller 38. The flow rate controls of the flow rate controllers 36 and 38 are performed by the controller 14.

The drying liquid supply unit 23 mixes the first chemical liquid supplied from the first chemical liquid supply unit 33 with the second chemical liquid supplied from the second chemical liquid supply unit 34 within one drying liquid supply nozzle 28, and supplies the mixed drying liquid to the substrate 3. The mixing portion of the first chemical liquid with the second chemical liquid may be the inside of the drying liquid supply nozzle 28, or the inside of the pipe connected to the drying liquid supply nozzle 28. Also, it is possible to employ a configuration where a drying liquid obtained by mixing the first chemical liquid with the second chemical liquid within a tank (not illustrated) at a predetermined ratio in advance may be supplied to the substrate 3. Otherwise, the first chemical liquid and the second chemical liquid may be supplied from separate nozzles, respectively to the substrate 3 so that the first chemical liquid and the second chemical liquid are mixed on the surface (the top surface) of the substrate 3. Also, the present disclosure is not limited to a case where a mixture obtained by mixing the first chemical liquid with the second chemical liquid within the substrate liquid processing apparatus 1 of the present disclosure is used as for the drying liquid. A mixture obtained by mixing the first chemical liquid with the second chemical liquid outside the substrate liquid processing apparatus 1 of the present disclosure may be used as for the drying liquid.

In the liquid collecting unit 13, an annular collecting cup 39 is disposed around the turn table 17. An opening which is one size larger than the turn table 17 (the substrate 3) is formed at the upper end of the collecting cup 39. A drain 40 is connected to the lower end of the collecting cup 39.

The liquid collecting unit 13 collects the processing liquid, the rinse liquid, or the drying liquid supplied to the surface of the substrate 3 by the collecting cup 39, and discharges the liquids to the outside through the drain 40. The drain 40 collects not only the liquids but also the gas (atmosphere) inside the processing chamber 15. Accordingly, clean air supplied from a fan filter unit (FFU) 41 provided at the top of the processing chamber 15 is allowed to flow down within the processing chamber 15. The FFU 41 is configured to supply clean dry air (CDA) and the clean air in a switching manner, and allows the CDA to flow down within the processing chamber 15 when supplying the CDA.

The substrate liquid processing apparatus 1 is configured as described above, and performs a processing of the substrate 3 under the control of the controller 14 according to various programs stored in the storage medium 42 provided in the controller 14 (a computer). Here, the storage medium 42 stores various setting data or programs, and is constituted by, for example, a memory (e.g., a ROM or a RAM), and a disk type storage medium (e.g., a hard disk, a CD-ROM, a DVD-ROM, or a flexible disk) which is conventionally known in the related art.

Figure 3:
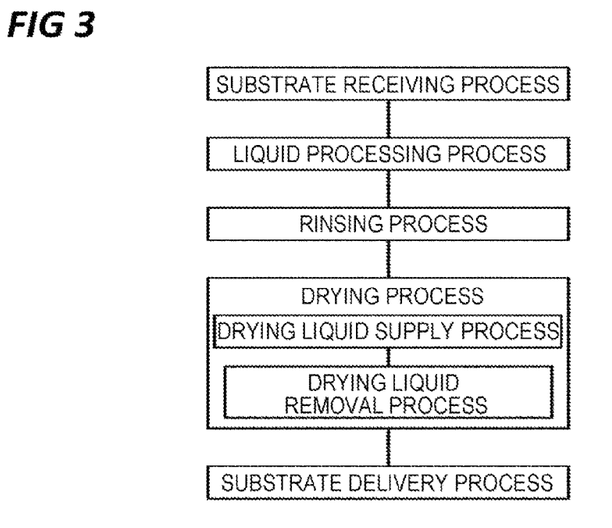
FIG. 3 is a flow chart illustrating a substrate liquid processing method.

Then, the substrate liquid processing apparatus 1 processes the substrate 3 as described below in accordance with a substrate liquid processing program stored in the storage medium 42 (see, e.g., FIG. 3).

First, in the substrate liquid processing apparatus 1, the substrate 3 conveyed by the substrate conveyance device 9 is received by the substrate liquid processing unit 10 (a substrate receiving process).

In the substrate receiving process, the controller 14 causes the substrate elevating mechanism 20 to raise the turn table 17 to a predetermined position. Then, one substrate 3 conveyed from the substrate conveyance device 9 into the processing chamber 15 is received while the substrate 3 is horizontally held by the substrate holders 18. Then, the turn table 17 is lowered by the substrate elevating mechanism 20 to a predetermined position. Also, in the substrate receiving process, the arm 25 (the processing liquid supply nozzle 26, the rinse liquid supply nozzle 27, and the drying liquid supply nozzle 28) is retreated to a stand-by position outside of the outer periphery of the turn table 17.

Then, the substrate liquid processing apparatus 1 supplies the processing liquid to the surface of the substrate 3 to perform a liquid processing of the substrate 3 (a liquid processing process).

Figure 4:
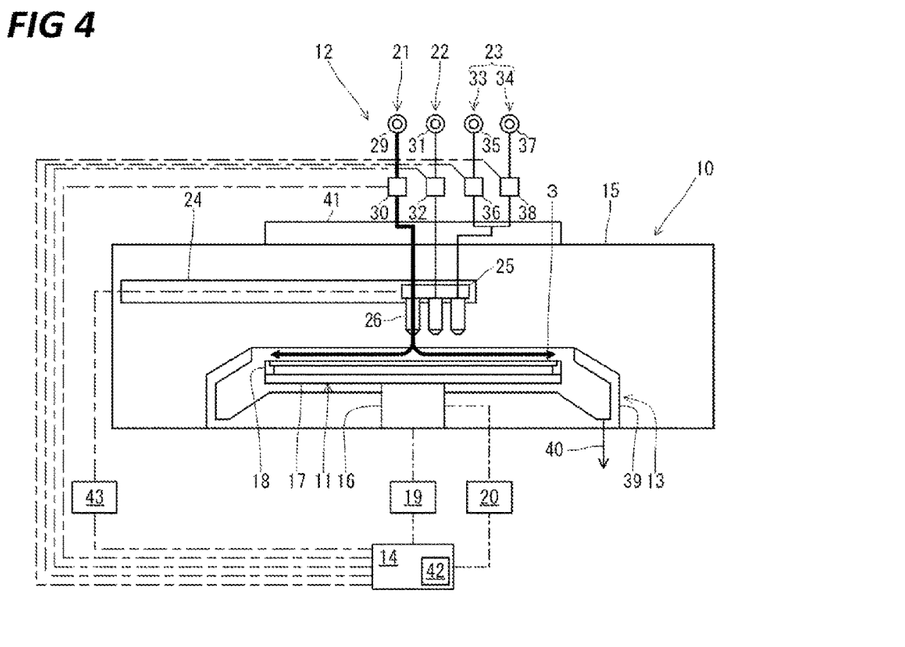
FIG. 4 is an explanatory view illustrating the substrate liquid processing method (a liquid processing process).

In the liquid processing process, as illustrated in FIG. 4, the controller 14 causes the nozzle moving mechanism 43 to move the arm 25 so as to dispose the processing liquid supply nozzle 26 to an ejecting position above the central portion of the substrate 3. Also, the turn table 17 is rotated by the substrate rotation mechanism 19 at a predetermined rotation speed to rotate the substrate 3. Then, the processing liquid of which the flow rate has been controlled to a predetermined flow rate by the flow rate controller 30 is ejected from the processing liquid supply nozzle 26 toward the surface (the top surface) of the substrate 3. Accordingly, the surface of the substrate 3 is subjected to a liquid processing by the processing liquid. The processing liquid supplied to the substrate 3 is shaken off by the centrifugal force of the substrate 3 that rotates to the outside of the outer periphery of the substrate 3, and is collected by the collecting cup 39 to be discharged to the outside through the drain 40. After the processing liquid is supplied for a predetermined time period, the ejection of the processing liquid is stopped by the flow rate controller 30. Here, as for the gas supplied from the FFU 41, clean air or CDA is selected according to the kind of the processing liquid.

Figure 5:
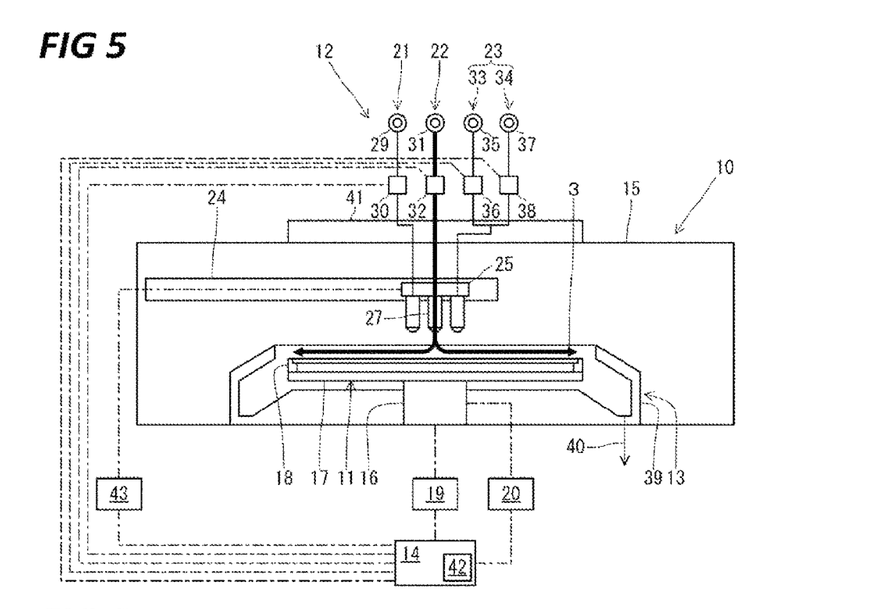
FIG. 5 is an explanatory view illustrating the substrate liquid processing method (a rinsing process).

Then, the substrate liquid processing apparatus 1 supplies the rinse liquid to the surface of the substrate 3 to rinse the substrate 3 (a rinsing process).

In the rinsing process, as illustrated in FIG. 5, the controller 14 causes the substrate rotation mechanism 19 to rotate the turn table 17 at a predetermined rotation speed. Then, while the substrate 3 is continuously rotated, the arm 25 is moved by the nozzle moving mechanism 43 so as to dispose the rinse liquid supply nozzle 27 to the ejecting position above the central portion of the substrate 3. Then, the rinse liquid, of which the flow rate has been controlled to a predetermined flow rate by the flow rate controller 32, is ejected from the rinse liquid supply nozzle 27 toward the surface of the substrate 3. Accordingly, the surface of the substrate 3 is rinsed by the rinse liquid. The rinse liquid supplied to the substrate 3 is shaken off by the centrifugal force of the substrate 3 that rotates, to the outside of the outer periphery of the substrate 3, and is collected by the collecting cup 39 to be discharged to the outside through the drain 40. After the rinse liquid is supplied for a predetermined time period, the ejection of the rinse liquid is stopped by the flow rate controller 32.

Then, the substrate liquid processing apparatus 1 performs a drying treatment for drying the surface of the substrate 3 (a drying process). The drying process includes a drying liquid supply process for supplying a drying liquid to the substrate 3, and a drying liquid removal process for removing the drying liquid supplied to the substrate 3 from the substrate 3.

Figure 6:
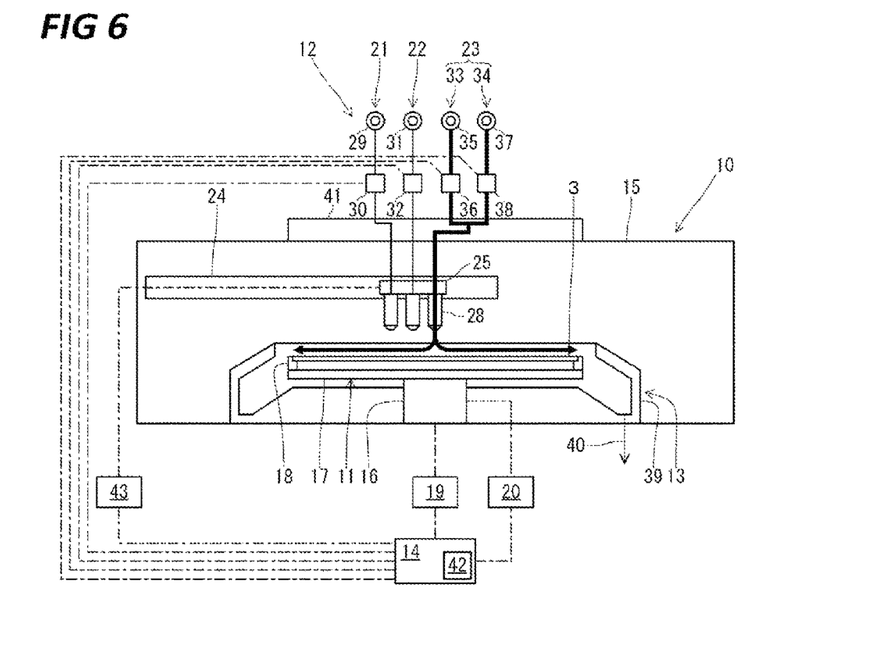
FIG. 6 is an explanatory view illustrating the substrate liquid processing method (a drying liquid (first and second chemical liquids) supply process).

In the drying liquid supply process, as illustrated in FIG. 6, the controller 14 causes the substrate rotation mechanism 19 to rotate the turn table 17 at a predetermined rotation speed. Then, while the substrate 3 is continuously rotated, the arm 25 is moved by the nozzle moving mechanism 43 so as to dispose the drying liquid supply nozzle 28 to the ejecting position above the central portion of the substrate 3. Then, a first chemical liquid and a second chemical liquid, of which flow rates have been controlled to predetermined flow rates by the flow rate controllers 36 and 38, are supplied to the drying liquid supply nozzle 28 at once, and the first chemical liquid and the second chemical liquid are mixed with each other within the drying liquid supply nozzle 28 to generate a drying liquid. The drying liquid is ejected from the drying liquid supply nozzle 28 toward the surface of the substrate 3. The drying liquid supplied to the substrate 3 is shaken off by the centrifugal force of the substrate 3 that rotates to the outside of the outer periphery of the substrate 3, and is collected by the collecting cup 39 to be discharged to the outside through the drain 40. After the drying liquid is supplied for a predetermined time period, the ejection of the drying liquid (the first chemical liquid and the second chemical liquid) is stopped by the flow rate controllers 36 and 38.

In the drying liquid removal process, the controller 14 causes the substrate rotation mechanism 19 to rotate the turn table 17 at a predetermined rotation speed so as to continuously rotate the substrate 3. Accordingly, the drying liquid remaining on the surface of the substrate 3 is shaken off by the action of the centrifugal force of the substrate 3 that rotates to the outside of the substrate 3. The drying liquid is removed from the surface of the substrate 3 and the surface of the substrate 3 is dried. Also, in the drying liquid removal process, the arm 25 (the processing liquid supply nozzle 26, the rinse liquid supply nozzle 27, and the drying liquid supply nozzle 28) is moved to be retreated to the stand-by position outside of the outer periphery of the turn table 17. In the drying liquid supply process and the drying liquid removal process, as for the gas supplied from the FFU 41, CDA may be selected. Also, in the drying liquid removal process, the removal of the drying liquid may be facilitated by supplying an inert gas such as, for example, a nitrogen gas to the surface of the substrate 3.

Finally, in the substrate liquid processing apparatus 1, the substrate 3 is delivered from the substrate liquid processing unit 10 to the substrate conveyance device 9 (a substrate delivery process).

In the substrate delivery process, the controller 14 causes the substrate elevating mechanism 20 to raise the turn table 17 to a predetermined position. Then, the substrate 3 held by the turn table 17 is delivered to the substrate conveyance device 9. Then, the turn table 17 is lowered by the substrate elevating mechanism 20 to a predetermined position.

As described above, in the substrate liquid processing apparatus 1 (in the substrate liquid processing method executed by the substrate liquid processing apparatus 1), the substrate 3 which has been subjected to the liquid processing by the processing liquid is rinsed by the rinse liquid, and then a drying treatment of the substrate 3 is performed by replacing the rinse liquid on the substrate 3 with the drying liquid, and removing the drying liquid from the substrate 3.

Then, in the substrate liquid processing apparatus 1, in the drying liquid supply process of the drying process, the drying liquid containing a silicon-based organic compound is used as the first chemical liquid. When a conventional drying liquid containing an alcohol-based organic compound was used, in some cases, pure water as a rinse liquid was not sufficiently replaced with the drying liquid, and the pure water as the rinse liquid remained on the surface of the substrate 3. As a result, in a drying process, there was a possibility that a fine pattern may collapse by the surface tension of the remaining rinse liquid. In the present exemplary embodiment, in at least a part of the process of supplying the drying liquid, an alcohol-based organic compound and a silicon-based organic compound are supplied at once so as to easily replace the pure water as the rinse liquid and to decompose the pure water that was not absorbed by the alcohol-based organic compound. As a result, the substrate 3 that has been subjected to the liquid processing is satisfactorily dried without collapsing the fine pattern. That is, the collapse of the pattern may be suppressed by using a drying liquid obtained by mixing the first chemical liquid, that is, a silicon-based organic compound, which is poor in a miscibility with pure water as the rinse liquid but is capable of decomposing the pure water, with the second chemical liquid which has a miscibility with the pure water as the rinse liquid. The silicon-based organic compound is not limited to the trimethylsilyl dimethylamine (TMSDMA), but, for example, trimethylsilyl dimethylamine (TMSDEA), hexamethyldisilazane (HMDS) or a silane coupling agent may be used. Also, the second chemical liquid is not limited to the isopropyl alcohol (IPA), but an organic compound such as, for example, other alcohols or ethers such as, for example, hydrofluoroether (HFE) may be used. As for the first chemical liquid and the second chemical liquid, chemical liquids having no reactivity may be selected so as to more easily maintain the properties of the chemical liquids, respectively.

Figure 7:
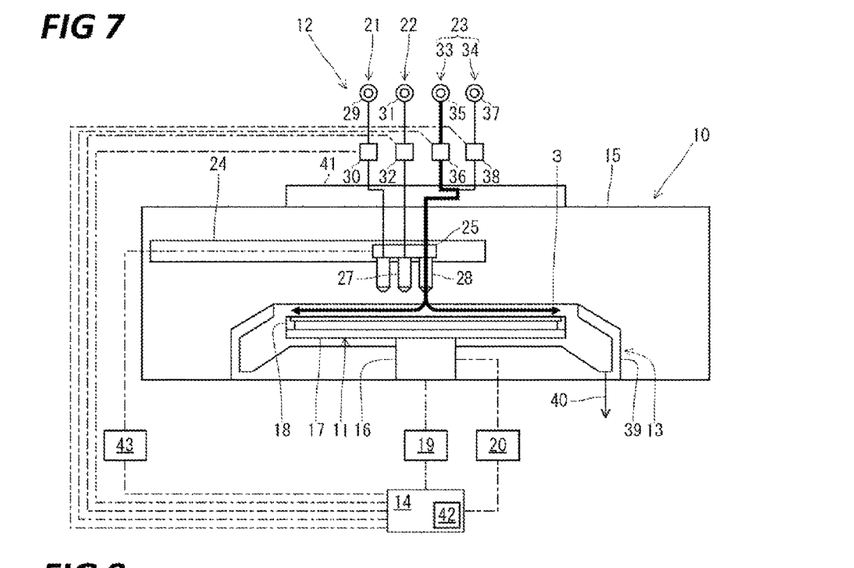
FIG. 7 is an explanatory view illustrating the substrate liquid processing method (a drying liquid (a first chemical liquid) supply process).

In the substrate liquid processing apparatus 1, in the drying liquid supply process of the drying process, the first chemical liquid and the second chemical liquid are supplied at once so that the mixed liquid of the first chemical liquid and the second chemical liquid is supplied as the drying liquid to the substrate 3 (a mixed liquid supply process), but the present disclosure is not limited thereto as long as the drying liquid contains a silicon-based organic compound. Only a drying liquid that contains the first chemical liquid (the silicon-based organic compound) and has a higher volatility than the pure water may be supplied as the drying liquid to the substrate 3 (see, e.g., FIG. 7).

In the substrate liquid processing apparatus 1, before the first chemical liquid (the silicon-based organic compound) is supplied to the substrate 3, the second chemical liquid (e.g., the alcohol-based organic compound that does not contain the silicon-based organic compound) is supplied to the substrate 3 (a pre-treatment process. see, e.g., FIG. 8), and the rinse liquid remaining on the substrate 3 is replaced with the second chemical liquid. Then, the mixed liquid of the first chemical liquid and the second chemical liquid may be supplied to the substrate 3 (see, e.g., FIG. 6) to replace the second chemical liquid. According to the present exemplary embodiment, first, after most of the rinse liquid on the substrate 3 is replaced with the second chemical liquid (e.g., the alcohol-based organic compound that does not contain the silicon-based organic compound), the mixed liquid is supplied to the substrate 3. Thus, when the first chemical liquid (the silicon-based organic compound) is supplied, the rest of the rinse liquid is reduced. Accordingly, the rinse liquid remaining on the substrate 3 may be satisfactorily replaced with the drying liquid containing the silicon-based organic compound. The supply amount of the first chemical liquid (the silicon-based organic compound) may be reduced. When the supply amount of the first chemical liquid (the silicon-based organic compound) is reduced, there is also an effect in that it is possible to reduce impurities that may remain when the first chemical liquid (the silicon-based organic compound) is dried.

Figure 8:
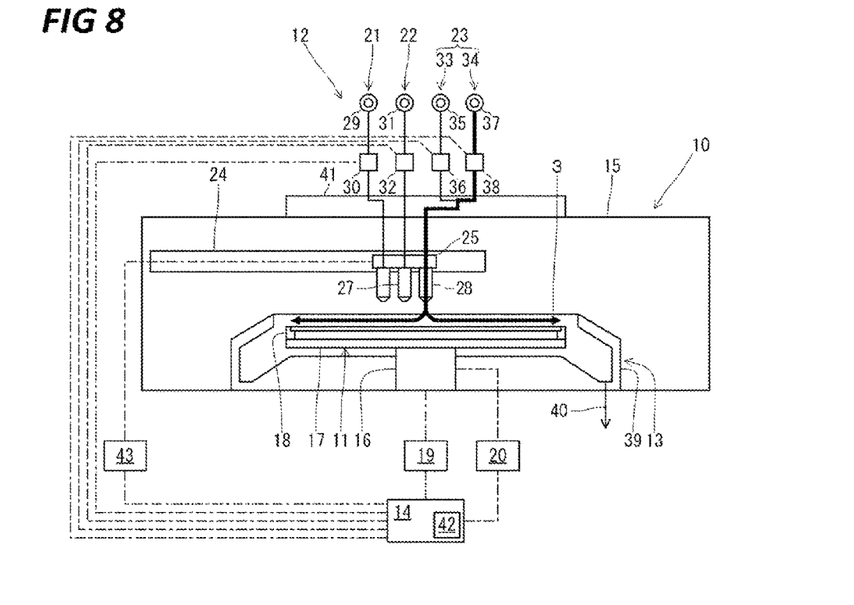
FIG. 8 is an explanatory view illustrating the substrate liquid processing method (a drying liquid (a second chemical liquid) supply process).

In the substrate liquid processing apparatus 1, after the drying liquid (the mixed liquid of the first chemical liquid and the second chemical liquid) containing the silicon-based organic compound is supplied to the substrate 3, the second chemical liquid (e.g., the alcohol-based organic compound that does not contain the silicon-based organic compound) may be supplied to the substrate 3 (the post-treatment process, see, e.g., FIG. 8). Accordingly, the substrate 3 is processed by the drying liquid that does not contain the silicon-based organic compound, and the impurities that may be included in the silicon-based organic compound (the first chemical liquid) may be satisfactorily removed from the substrate 3 by the second chemical liquid (e.g., the alcohol-based organic compound that does not contain the silicon-based organic compound) so as to prevent particles from remaining on the substrate 3 or watermarks from being generated.

In the substrate liquid processing apparatus 1, before the first chemical liquid (the silicon-based organic compound) is supplied to the substrate 3, the second chemical liquid (e.g., the alcohol-based organic compound that does not contain the silicon-based organic compound) is supplied to the substrate 3 (the pre-treatment process, see, e.g., FIG. 8.) to replace the rinse liquid remaining on the substrate 3 with the second chemical liquid. Then, the mixed liquid of the first chemical liquid and the second chemical liquid is supplied to the substrate 3 (see, e.g., FIG. 6.) to replace the second chemical liquid. Then, the second chemical liquid (e.g., the alcohol-based organic compound that does not contain the silicon-based organic compound) may be supplied to the substrate 3 (the post-treatment process, see, e.g., FIG. 8). Also, only the first chemical liquid may be supplied at least at a predetermined time during a period when the mixed liquid of the first chemical liquid and the second chemical liquid is supplied to the substrate 3, or at a predetermined time before or after a period when the mixed liquid of the first chemical liquid and the second chemical liquid is supplied to the substrate 3.

When the pre-treatment process is shifted to the mixed liquid supply process or the mixed liquid supply process is shifted to the post-treatment process, the first chemical liquid and the second chemical liquid may be supplied to the substrate 3 from the same nozzle or separate nozzles while a mixing ratio of the first chemical liquid and the second chemical liquid is changed in a stepwise manner, or the mixing ratio is gradually continuously changed. Accordingly, since the wettability of the substrate 3 is gradually changed, it is easy to prevent the surface of the substrate 3 from being exposed to the outside air as compared to when the wettability is abruptly changed. For example, at the time of starting supply, the mixing ratio of the second chemical liquid to the first chemical liquid is 1:0, but with elapse of time, the supply amount of the first chemical liquid is increased and the supply amount of the second chemical liquid is decreased. Then, when the mixing ratio reaches a predetermined ratio, the chemical liquids are supplied for a predetermined time period at the corresponding ratio. Then, in a stepwise manner or continuously, the supply amount of the second chemical liquid may be increased while the supply amount of the first chemical liquid may be decreased. The mixing ratio of the first chemical liquid to the second chemical liquid may be determined in consideration of preventing occurrence of impurities that may be included in the silicon-based organic compound (the first chemical liquid) as far as possible.

Figure 9:
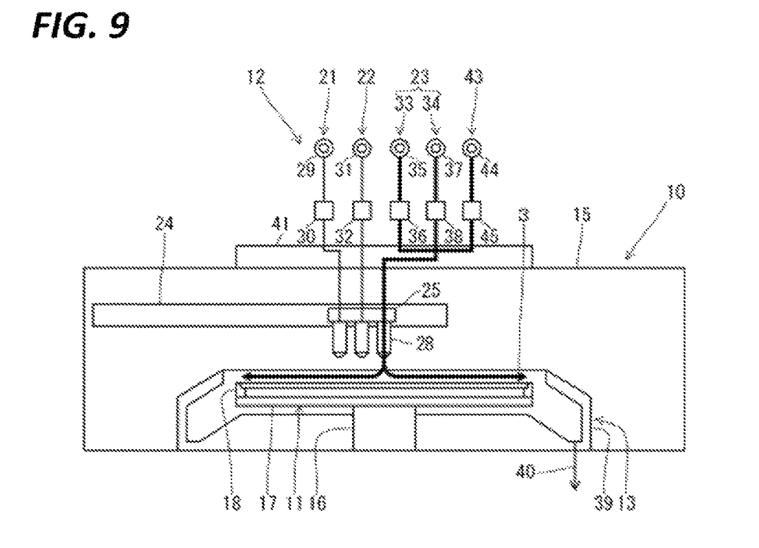
FIG. 9 is an explanatory view illustrating the substrate liquid processing method (active agent supply).

A function of supplying an active agent may be added to the substrate liquid processing apparatus 1. For example, as illustrated in FIG. 9, an active agent supply unit 43 configured to supply an active agent is connected to the drying liquid supply unit 23. In the active agent supply unit 43, an active agent supply source 44 is connected to the drying liquid supply nozzle 28 through a pipe and a flow rate controller 45. Then, for example, when the mixed liquid of the first chemical liquid and the second chemical liquid is supplied, the active agent is added to be supplied to the substrate 3. Accordingly, a reaction between the silicon-based organic compound (the first chemical liquid) and the pure water may be activated.

Figure 10:
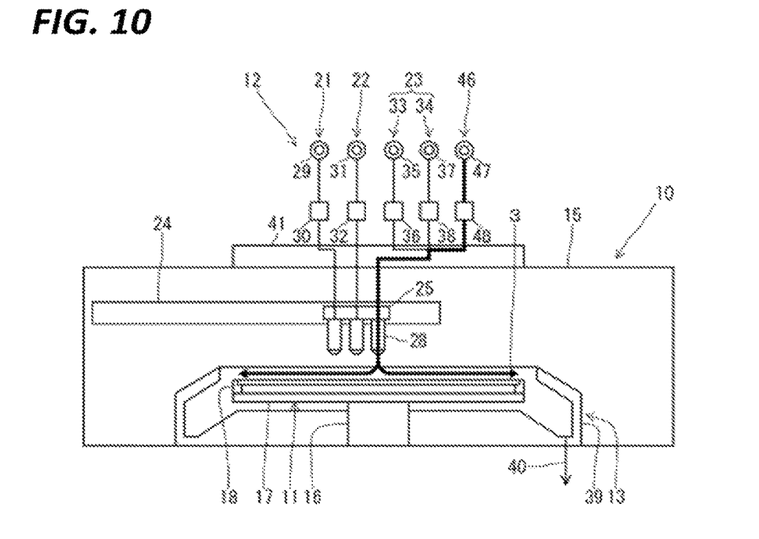
FIG. 10 is an explanatory view illustrating the substrate liquid processing method (PGMEA supply).

A function of supplying PGMEA may be added to the substrate liquid processing apparatus 1. For example, as illustrated in FIG. 10, a PGMEA supply unit 46 configured to supply the PGMEA is connected to the drying liquid supply unit 23. In the PGMEA supply unit 46, a PGMEA supply source 47 is connected to the drying liquid supply nozzle 28 through a pipe and a flow rate controller 48. Then, after the rinsing process, IPA is supplied as the second chemical liquid to the substrate 3, and then, PGMEA is supplied from the PGMEA supply unit 46 to the substrate 3. Then, a mixed liquid of the first chemical liquid and the second chemical liquid (IPA) is supplied. The PGMEA has a specific gravity greater than the mixed liquid of the IPA and the pure water. Therefore, when the PGMEA is supplied after the IPA is supplied to the substrate 3, on the surface of the substrate 3, the PGMEA is present at the lower side, and the mixed liquid of the IPA and the pure water is present at the upper side. Accordingly, it becomes easy to remove the pure water from the surface of the substrate 3. Also, for example, when the first chemical liquid is supplied, the PGMEA may be added as a diluent to be supplied to the substrate 3.

In the present exemplary embodiment, drying in a rinsing process after a cleaning process or an etching process has been described, but the present disclosure is not limited thereto. The present disclosure may be applicable to drying after a substrate liquid processing using pure water.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing apparatus comprising:
a substrate rotation driver configured to rotate a substrate held by a substrate holder;
a processing liquid supply nozzle, a rinse liquid supply nozzle, and a drying liquid supply nozzle that are separately provided from each other, each of which being attached to an arm that extends above the substrate, the arm being movable in a horizontal direction;
a processing liquid supplier connected to a processing liquid supply source and configured to supply a processing liquid from the processing liquid supply source to the processing liquid supply nozzle through a first pipe, a first end of the first pipe being connected to the processing liquid supply source and a second end of the first pipe being connected to the processing liquid supply nozzle;
a rinse liquid supplier connected to a rinse liquid supply source and configured to supply a rinse liquid including pure water from the rinse liquid supply source to the rinse liquid supply nozzle through a second pipe, a first end of the second pipe being connected to the rinse liquid supply source and a second end of the second pipe being connected to the rinse liquid supply nozzle;
a drying liquid supplier comprising a first chemical liquid supplier and a second chemical liquid supplier;
wherein the first chemical liquid supplier includes a first chemical liquid supply source and is configured to supply a first chemical liquid containing a silicon-based organic compound from the first chemical liquid supply source to a first end of a third pipe through the third pipe, the second end of the third pipe being connected to the first chemical liquid supply source, the second chemical liquid supplier includes a second chemical liquid supply source and is configured to supply a second chemical liquid containing another organic compound including an alcohol-based organic compound from the second chemical liquid supply source to a first end of a fourth pipe through the fourth pipe, the second end of the fourth pipe being connected to the second chemical liquid supply source, the first end of the third pipe and the first end of the fourth pipe are merged to be connected to a first end of a fifth pipe, and a second end of the fifth pipe is connected to the drying liquid supply nozzle, and a simultaneous supply of the first chemical liquid and the second chemical liquid yields a drying liquid having a higher volatility than the pure water, and a controller configured to control the substrate rotation driver, the processing liquid supplier, the rinse liquid supplier, and the drying liquid supplier, such that:

the controller directs the substrate rotation driver to rotate the substrate, then while the substrate is being rotated, the controller directs the arm so that the processing liquid supply nozzle is disposed at an ejecting position above a central portion of the substrate, and the controller controls the processing liquid supplier to supply the processing liquid to the surface of the substrate;

then while the substrate is still being rotated, the controller directs the arm so that the rinse liquid supply nozzle is disposed at the ejecting position, and the controller controls the rinse liquid supplier to supply the rinse liquid to the surface of the substrate, such that the rinse liquid including the pure water replaces the processing liquid;

then while the substrate is still being rotated, the controller directs the arm so that the drying liquid supply nozzle is disposed at the ejecting position, and the controller controls the first chemical liquid supplier and the second chemical liquid supplier such that the first chemical liquid and the second chemical liquid are simultaneously supplied to be mixed with each other, and a mixed liquid of the first chemical liquid and the second chemical liquid, which yields the drying liquid having the higher volatility than the pure water is supplied to the surface of the substrate, thereby causing a hydrolysis reaction between the rinse liquid including the pure water and the silicon-based organic compound of the first chemical liquid, and decomposing any remaining rinse liquid on the surface of the substrate to replace the rinse liquid with the mixed liquid; and then the controller directs the substrate rotation driver to continue rotating the substrate until the mixed liquid is removed from the substrate, wherein the drying liquid supplier further comprises an active agent supplier connected to an active agent supply source and configured to supply an active agent through a sixth pipe from the active agent supply source to a first end of the sixth pipe that is merged with the first end of each of the third pipe and the fourth pipe to be connected to the first end of the fifth pipe, a second end of the sixth pipe being connected to the active agent supply source;

wherein, when the mixed liquid of the first chemical liquid and the second chemical liquid is supplied to the substrate, the controller directs the active agent supplier to simultaneously supply the active agent; and wherein after the mixed liquid is supplied to the surface of the substrate, the controller directs the drying liquid supplier to supply the second chemical liquid without a simultaneous supply of the first chemical liquid or the active agent.

2. The substrate liquid processing apparatus of claim 1, wherein after the rinse liquid is supplied to the surface of the substrate, and before the mixed liquid is supplied to the substrate, the controller directs the drying liquid supplier to supply the second chemical liquid without a simultaneous supply of the first chemical liquid.

3. The substrate liquid processing apparatus of claim 1, wherein the drying liquid supplier is configured to mix the first chemical liquid with the second chemical liquid before the mixed liquid is ejected from the drying liquid supply nozzle.

4. The substrate liquid processing apparatus of claim 1, wherein, when the controller controls the first chemical liquid supplier and the second chemical liquid supplier such that the mixed liquid is supplied to the surface of the substrate, a mixing ratio of the first chemical liquid to the second chemical liquid is changed in a stepwise or continuous manner.

5. A substrate liquid processing apparatus comprising:
a substrate rotation drive configured to rotate a substrate held by a substrate holder;
a processing liquid supply nozzle, a rinse liquid supply nozzle, and a drying liquid supply nozzle that are separately provided from each other, each of which being attached to an arm that extends above the substrate, the arm being movable in a horizontal direction;
a processing liquid supplier connected to a processing liquid supply source and configured to supply a processing liquid from the processing liquid supply source to the processing liquid supply nozzle through a first pipe, a first end of the first pipe being connected to the processing liquid supply source and a second end of the first pipe being connected to the processing liquid supply nozzle;
a rinse liquid supplier connected to a rinse liquid supply source and configured to supply a rinse liquid including pure water from the rinse liquid supply source to the rinse liquid supply nozzle through a second pipe, a first end of the second pipe being connected to the rinse liquid supply source and a second end of the second pipe being connected to the rinse liquid supply nozzle;
a drying liquid supplier comprising a first chemical liquid supplier and a second chemical liquid supplier;
wherein the first chemical liquid supplier includes a first chemical liquid supply source and is configured to supply a first chemical liquid containing a silicon-based organic compound from the first chemical liquid supply source to a first end of a third pipe through the third pipe, the second end of the third pipe being connected to the first chemical liquid supply source,
the second chemical liquid supplier includes a second chemical liquid supply source and is configured to supply a second chemical liquid containing another organic compound including an alcohol-based organic compound from the second chemical liquid supply source to a first end of a fourth pipe through the fourth pipe, the second end of the fourth pipe being connected to the second chemical liquid supply source,
the first end of the third pipe and the first end of the fourth pipe are merged to be connected to a first end of a fifth pipe, and a second end of the fifth pipe is connected to the drying liquid supply nozzle, and
a simultaneous supply of the first chemical liquid and the second chemical liquid yields a drying liquid having a higher volatility than the pure water, and
a controller configured to control the substrate rotation driver, the processing liquid supplier, the rinse liquid supplier, and the drying liquid supplier, such that:
the controller directs the substrate rotation driver to rotate the substrate,
then while the substrate is being rotated, the controller directs the arm so that the processing liquid supply nozzle is disposed at an ejecting position above a central portion of the substrate, and the controller controls the processing liquid supplier to supply the processing liquid to the surface of the substrate;
then while the substrate is still being rotated, the controller directs the arm so that the rinse liquid supply nozzle is disposed at the ejecting position, and the controller controls the rinse liquid supplier to supply the rinse liquid to the surface of the substrate, such that the rinse liquid including the pure water replaces the processing liquid;
then while the substrate is still being rotated, the controller directs the arm so that the drying liquid supply nozzle is disposed at the ejecting position, and the controller controls the first chemical liquid supplier and the second chemical liquid supplier such that the first chemical liquid and the second chemical liquid are simultaneously supplied to be mixed with each other, and a mixed liquid of the first chemical liquid and the second chemical liquid , which yields the drying liquid having the higher volatility than the pure water, is supplied to the surface of the substrate, thereby causing a hydrolysis reaction between the rinse liquid including the pure water and the silicon-based organic compound of the first chemical liquid, and decomposing any remaining rinse liquid on the surface of the substrate to replace the rinse liquid with the mixed liquid; and
then the controller directs the substrate rotation driver to continue rotating the substrate until the mixed liquid is removed from the substrate,
wherein IPA is used as the second chemical liquid,
wherein the drying liquid supplier further comprises a PGMEA supplier connected to a PGMEA supply source and configured to supply PGMEA through a sixth pipe from the PGMEA supply source to a first end of the sixth pipe, a first end of the sixth pipe being merged with the first end of each of the third pipe and the fourth pipe to be connected to the first end of the fifth pipe, and a second end of the sixth pipe being connected to the PGMEA supply source, and
wherein after the rinse liquid is supplied to the surface of the substrate, and before the mixed liquid is supplied to the substrate, the controller directs the drying liquid supplier to supply the second chemical liquid without a simultaneous supply of the first chemical liquid, then the controller directs the PGMEA supplier to supply PGMEA without a simultaneous supply of the first chemical liquid or the second chemical liquid.

* * * * *